(12) United States Patent
Hong

(10) Patent No.: US 6,274,477 B1
(45) Date of Patent: *Aug. 14, 2001

(54) METHOD OF FABRICATING CONDUCTIVE LINE STRUCTURE

(75) Inventor: Gary Hong, Hsinchu (TW)

(73) Assignee: United Microelectronics Corp. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/336,554

(22) Filed: Jun. 19, 1999

(51) Int. Cl.[7] .................................................. H01L 21/28
(52) U.S. Cl. ............................................ 438/624; 257/386
(58) Field of Search .......................... 438/624, FOR 355, 438/FOR 438; 257/386

(56) References Cited

U.S. PATENT DOCUMENTS 5,641,712 * 6/1997 Grivna et al. .
5,750,415 * 5/1998 Gnade et al. .
6,035,530 * 5/1999 Hong .

* cited by examiner

Primary Examiner—George Fourson
Assistant Examiner—Thanh V Pham
(74) Attorney, Agent, or Firm—Martine & Penilla, LLP

(57) ABSTRACT

A method of fabricating a conductive line structure. A first dielectric layer is formed on a substrate. A conductive layer is formed on the first dielectric layer. The conductive layer is patterned to form an opening in the conductive layer. The opening exposes a portion of the first dielectric layer. A conformal stop layer is formed over the substrate. The conformal stop layer is conformal to the conductive layer. An oxide layer is formed in the opening. The oxide layer does not completely fill the opening. A portion of a sidewall of the opening is exposed. A spacer is formed on the exposed sidewall of the opening. The oxide layer is removed. A second dielectric layer is formed over the substrate to fill the opening. A void is formed in the second dielectric layer in the opening.

20 Claims, 4 Drawing Sheets

METHOD OF FABRICATING CONDUCTIVE LINE STRUCTURE

BACKGROUND OF THE INVENTION

1. Field of the Invention

The present invention relates to a semiconductor fabrication method. More particularly, the present invention relates to a method of fabricating a conductive line structure.

2. Description of the Related Art

As linewidth of a semiconductor device reduces, distance between conductive layers is accordingly reduced. This, in turn, causes a parasitic capacitor effect to become serious. The dielectric constant of an inter-metal dielectric (IMD) layer between the conductive layers is an important factor in the prevention of the parasitic capacitor effect. As the dielectric constant increases, the parasitic capacitor effect occurs more easily. Thus, a resistance-capacitance time delay (RC delay) is increased. The increase in the RC delay may further decrease the operation speed of devices. Therefore, it is necessary to lower the dielectric constant of a dielectric layer, so as to decrease the RC delay and increase the operation speed.

Reference is made to FIG. 1, which shows a conventional conductive line structure. A first dielectric layer 102 is formed on a substrate 100. A conductive line 104 is formed on the first dielectric layer 102. A second dielectric layer 106 is formed over the substrate 100.

Because the conductive layer 104 is conductive and the dielectric material is formed between neighboring conductive lines 104, it easily induces a parasitic effect. In addition, as the distance between neighboring conductive lines 104 decreases, the parasitic capacitance increases. Thus, the RC delay becomes serious.

SUMMARY OF THE INVENTION

The invention provides a method of fabricating a conductive line structure. A first dielectric layer is formed on a substrate. A patterned conductive layer is formed on the first dielectric layer. The patterned conductive layer comprises an opening. The opening exposes a portion of the first dielectric layer. A conformal stop layer is formed over the substrate. The conformal stop layer is conformal to the conductive layer. An oxide layer is formed in the opening but does not completely fill the opening. A portion of a sidewall of the opening is exposed. A spacer is formed on the exposed sidewall of the opening. The oxide layer is removed. A second dielectric layer is formed over the substrate to fill the opening. A void is formed in the second dielectric layer in the opening.

The void is full of air, whose dielectric constant is low. Thus, because of the formation of the void, the dielectric constant in the opening is decreased. The parasitic effect is reduced and RC delay is decreased, as well.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
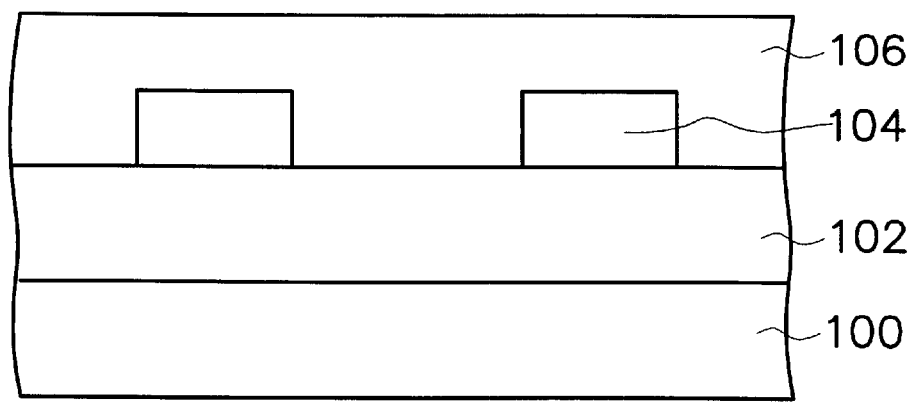
FIG. 1 is a schematic, cross-sectional view showing a conventional conductive line structure.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2D are schematic, cross-sectional views showing a fabricating method for a conductive line structure according to one preferred embodiment of the invention.

Figure 2A:
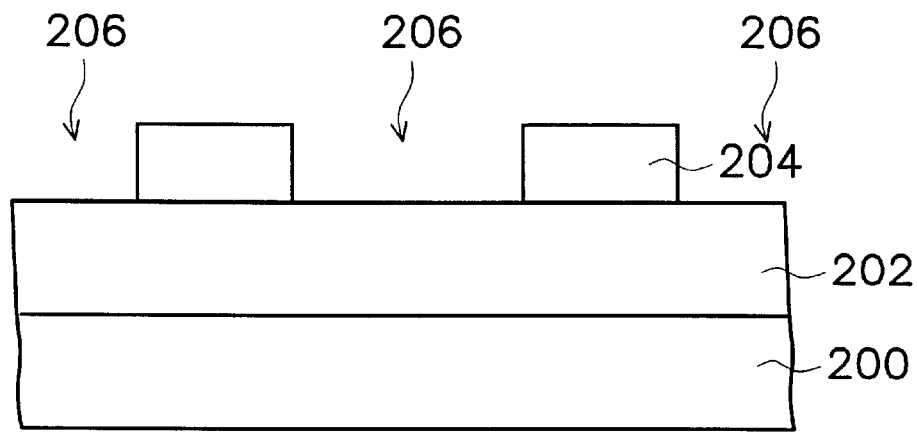
FIGS. 2A through 2D are schematic, cross-sectional views showing a fabricating method for a conductive line structure according to one preferred embodiment of the invention.

In FIG. 2A, a first dielectric layer 202 is formed on a substrate 200. A patterned conductive layer 204 is formed on the first dielectric layer 202. The patterned conductive layer serves as conductive lines. As shown in the figure, the patterned conductive layer 204 comprises several conductive lines. An opening 206 is formed in the patterned conductive layer 204. The opening 206 exposes a portion of the first dielectric layer 202. The material of the first dielectric layer 202 comprises oxide. The material of the conductive layer 204 comprises aluminum.

Figure 2B:
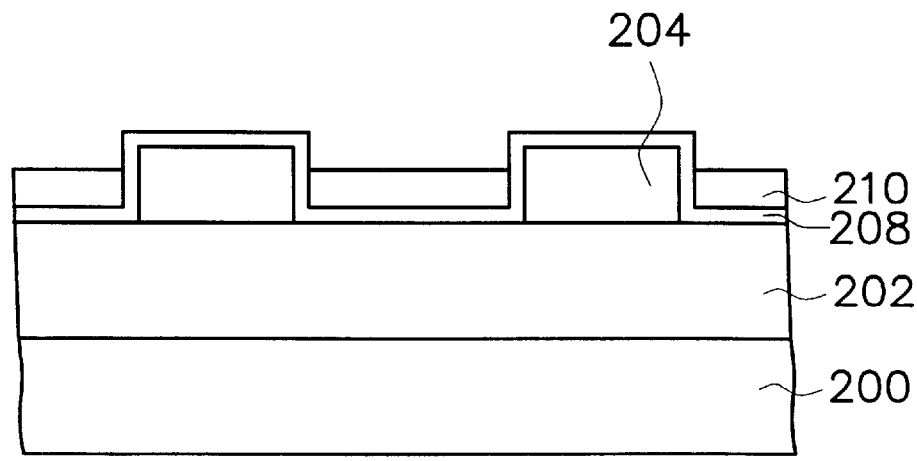

In FIG. 2B, a conformal stop layer 208 is formed over the substrate 200. The conformal stop layer 208 is conformal to the conductive layer 204. The material of the stop layer 208 comprises nitride. An oxide layer 210 is formed in the opening 206. The oxide layer 210 does not completely fill the opening 206. The surface of the oxide layer 210 is lower than the surface of the conductive layer 204, so that a portion of the sidewall of the opening 206 is exposed. The oxide layer 210 can be formed by the following exemplary steps. An oxide material (not shown) is formed to cover the stop layer 208. A chemical-mechanical polishing step is performed. The oxide material on the conductive layer 204 and a portion of the oxide layer 210 in the opening 206 are removed to form the oxide layer 210. Since the stop layer 208 is harder than the oxide layer 210, the removal rate for the stop layer 208 is lower than the removal rate for the oxide layer 210. Thus, after the chemical-mechanical polishing step, the surface of the oxide layer 210 is lower than the surface of the conductive layer 204.

Figure 2C:
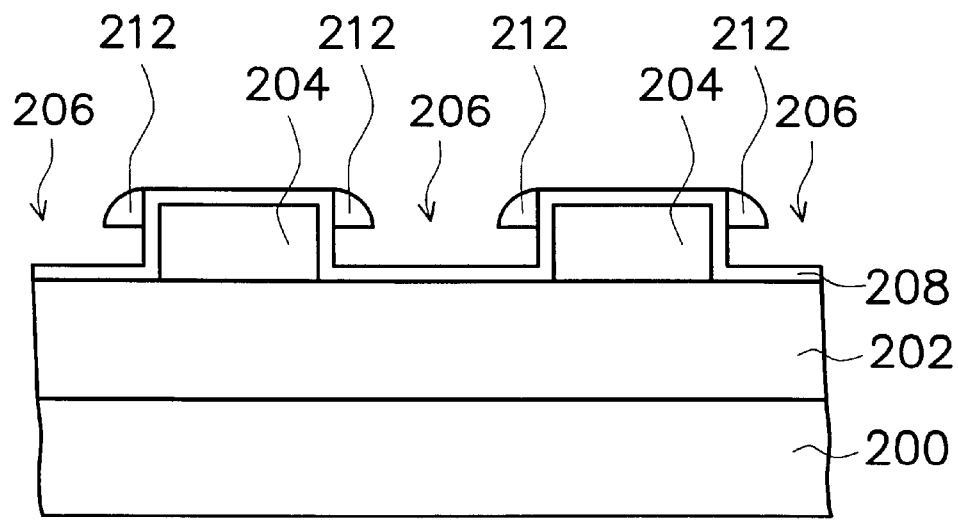

In FIG. 2C, a spacer 212 is formed on the exposed sidewall of the opening 206. The oxide layer 210 is removed by, for example, wet etching with a hydrofluoric acid (HF) solution. The material of the spacer 212 comprises nitride. The spacer 212 can be formed by the following exemplary steps. A nitride layer (not shown) is formed over the substrate 200. An etching back step is performed. A spacer 212 is formed on the exposed sidewall of the opening 206.

Figure 2D:
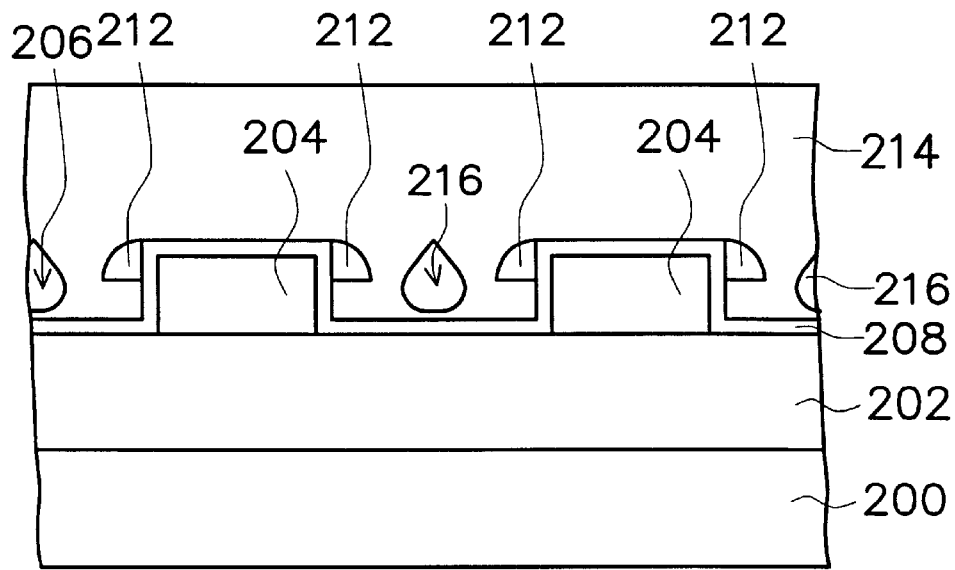

In FIG. 2D, the second dielectric layer 214 is formed over the substrate 200. The step of forming the second dielectric layer 214 comprises atmospheric pressure chemical vapor deposition or low-pressure chemical vapor deposition. Since spacer 212 is present, it is difficult for the dielectric layer 214 to fill completely the opening 206. In fact, the second dielectric layer 214 does not entirely fill the opening 206, and a void 216 thus is formed when the second dielectric layer 214 partially fills the opening 206.

The void 216 is full of air, whose dielectric constant is low. Thus, because of the formation of the void 216, the dielectric constant between the conductive layer 204 and the neighboring conductive layer 204 is decreased. The parasitic effect is reduced and RC delay is decreased, as well.

FIGS. 3A through 3D are schematic, cross-sectional views showing a fabricating method for a conductive line structure according to another preferred embodiment of the invention.

Figure 3A:
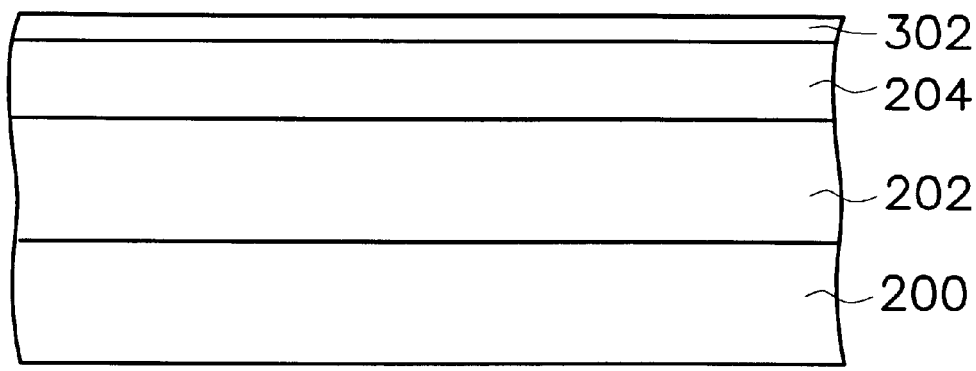
FIGS. 3A through 3D are schematic, cross-sectional views showing a fabricating method for a conductive line structure according to another preferred embodiment of the invention.

In FIG. 3A, a first dielectric layer 202 is formed on a substrate 200. A conductive layer 204 is formed on the first dielectric layer 202. A covering layer 302 is formed on the conductive layer 204. The material of the first dielectric layer 202 comprises oxide. The material of the conductive layer 204 comprises aluminum. The material of the covering layer 302 comprises nitride.

Figure 3B:
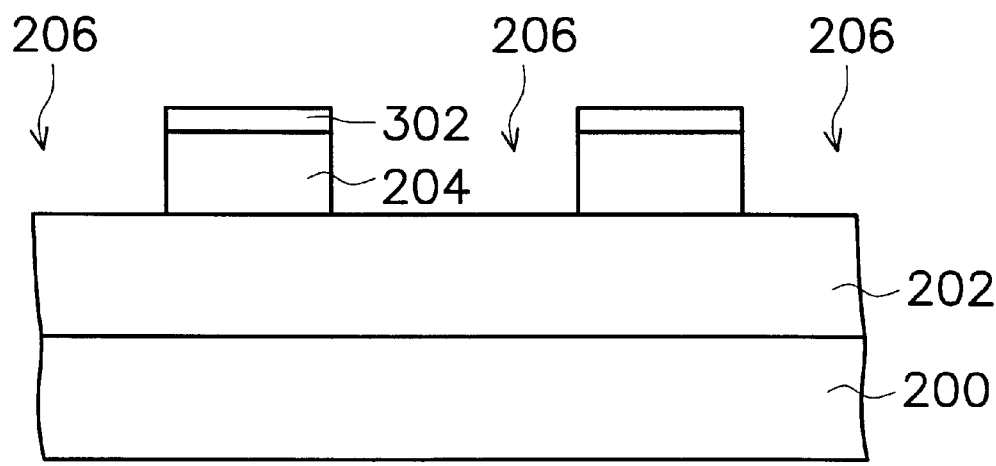

In FIG. 3B, the covering layer 302 and the conductive layer 204 are patterned to form an opening 206. The opening 206 exposes a portion of the first dielectric layer 202. The opening 206 can be formed by, for example, photolithography. The patterned conductive layer 204 serves as a conductive line.

Figure 3C:
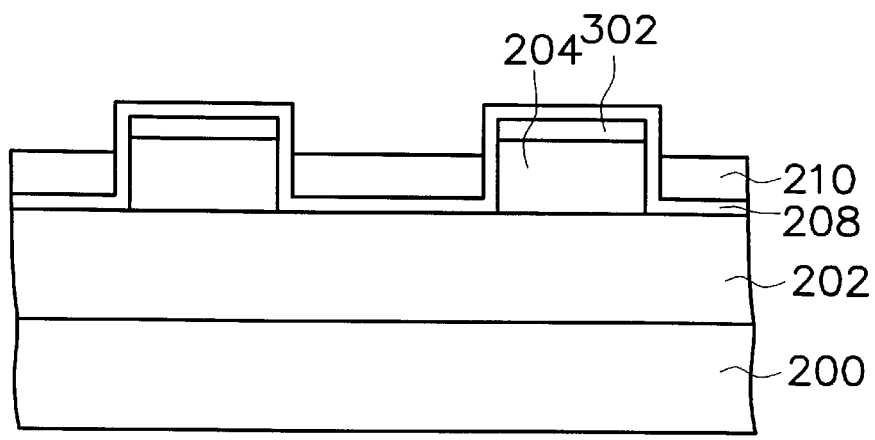

In FIG. 3C, a conformal stop layer 208 is formed over the substrate 200. The conformal stop layer 208 is conformal to the patterned covering layer 302 and the patterned conductive layer 204. The material of stop layer 208 comprises nitride. The stop layer 208 can be formed by, for example, deposition. An oxide layer 210 is formed in the opening 206. The oxide layer 210 does not completely fill the opening 206. A portion of the sidewall of the opening 206 is exposed. The oxide layer 210 can be formed by the following exemplary steps. An oxide material (not shown) is formed to cover the stop layer 208 and fill the opening 206. A chemical-mechanical polishing step is performed. Since the stop layer 208 is harder than the oxide layer, the removal rate for the oxide material is higher than the removal rate of the stop layer 208. The oxide material on the conductive layer 204 and a portion of the oxide layer 210 in the opening 206 are removed. Thus, the oxide layer 210 incompletely filling the opening 206 is formed.

Because the stop layer 208 is thin, the stop layer 208 may be removed during the chemical-mechanical polishing step. The covering layer 302 is used to protect the conductive layer 204 while the stop layer 208 is removed. Because the covering layer 302 protects the conductive layer 204, the conductive layer 204 is not damaged.

Figure 3D:
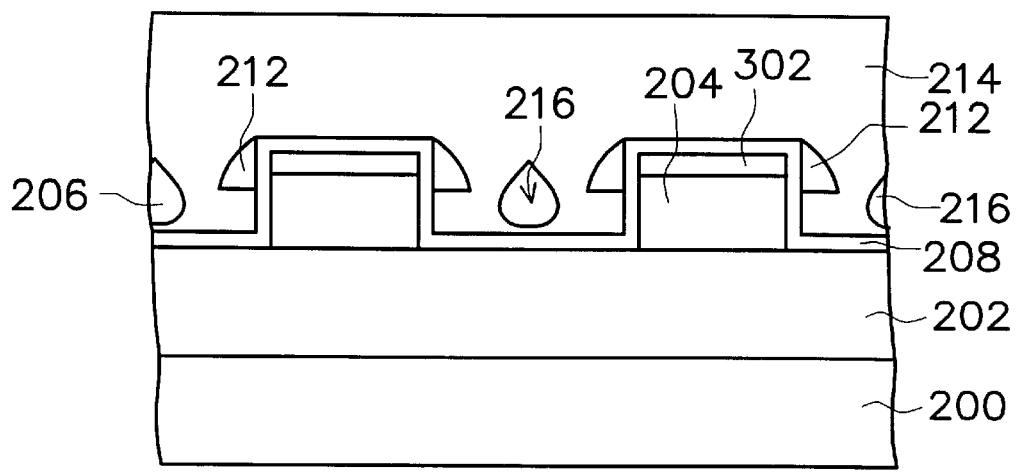

In FIG. 3D, a spacer 212 is formed on the exposed sidewall of the opening 206. The oxide layer 210 is removed. A second dielectric layer 214 is formed over the substrate 200. A void 216 is formed in the second dielectric layer 214. These steps are the same as those in the first preferred embodiment, so they are not here described again.

In the invention, after forming the oxide layer 210 in the opening 206, the oxide layer 210 does not entirely fill the opening 206. In this manner, a portion of the sidewall of the opening 206 is exposed. The exposed sidewall of the opening 206 is advantageous for forming the spacer 212. While forming the second dielectric layer 214, the spacer 212 makes it difficult for the second dielectric layer 214 to fill the entire opening 206. The void 216 thus is formed in the opening 206. Because the void 216 is full of air, the dielectric constant between conductive layers 204 decreases and the parasitic capacitor effect is decreased, as well.

Because the removal rate for the stop layer 208 is lower than the removal rate for the oxide layer 210, after chemical-mechanical polishing, the surface of the oxide layer 210 is lower than the surface of the conductive layer 204. In addition, the covering layer 302 in the second preferred embodiment is used to prevent the conductive line 204 from being damaged. Since the stop layer 208 is thin, the stop layer 208 may be removed during chemical-mechanical polishing. Once the stop layer 208 is removed, the covering layer 302 can also serve as a polishing stop layer to protect conductive layer 204. Thus, it is advantageous to the oxide layer 210 incompletely fill the opening 206 with the oxide layer 210.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a conductive line structure, comprising:

forming a first dielectric layer on a substrate;

forming a conductive layer on the first dielectric layer;

patterning the conductive layer to form an opening in the conductive layer, wherein the opening exposes a portion of the first dielectric layer;

forming a conformal stop layer over the substrate, wherein the conformal stop layer is conformal to the conductive layer;

forming an oxide layer in the opening, wherein the oxide layer does not completely fill the opening and a portion of a sidewall of the opening is exposed;

forming a spacer on the exposed sidewall of the opening;

removing the oxide layer; and forming a second dielectric layer over the substrate to fill the opening, wherein a void is formed in the second dielectric layer in the opening.

2. The method of claim 1, wherein the material of the conductive layer comprises aluminum.

3. The method of claim 1, wherein the material of the stop layer comprises nitride.

4. The method of claim 1, wherein the steps for forming the oxide layer in the opening comprise:

forming an oxide material to cover the stop layer and fill the opening; and performing a planarization step, wherein the oxide material on the conductive layer and a portion of the oxide material in the opening are removed, and a portion of the sidewall of the opening is exposed.

5. The method of claim 4, wherein the planarization step comprises chemical-mechanical polishing.

6. The method of claim 1, wherein the material of the spacer comprises nitride.

7. The method of claim 6, wherein the steps for forming the spacer comprise:

forming a nitride layer to cover the oxide layer and the stop layer; and performing an etching back step.

8. The method of claim 1, wherein the step of forming the second dielectric layer comprises atmospheric pressure chemical vapor deposition.

9. The method of claim 1, wherein the step of forming the second dielectric layer comprises low-pressure chemical vapor deposition.

10. The method of claim 1, wherein the step of removing the oxide layer comprises performing a wet etching with a hydrofluoric acid solution.

11. A method of fabricating a conductive line structure, comprising:

forming a first dielectric layer on a substrate;

forming a conductive layer on the first dielectric layer;

forming a covering layer on the conductive layer;

patterning the conductive layer and the covering layer to form an opening, wherein the opening exposes the first dielectric layer;

forming a conformal stop layer over the substrate, wherein the conformal stop layer is conformal to the conductive layer and the covering layer;

forming an oxide layer in the opening, wherein the oxide layer does not completely fill the opening, and a portion of a sidewall of the opening is exposed;

forming a spacer on the exposed sidewall of the opening;

removing the oxide layer; and forming a second dielectric layer over the substrate to fill the opening, wherein a void is formed in the second dielectric layer in the opening.

12. The method of claim 11, wherein the material of the conductive layer comprises aluminum.

13. The method of claim 11, wherein the material of the stop layer comprises nitride.

14. The method of claim 11, wherein the steps of forming the oxide layer in the opening comprise:

forming an oxide material to cover the stop layer and fill the opening; and performing a chemical-mechanical polishing step, wherein the oxide material on the conductive layer and a portion of the oxide material in the opening are removed, and a portion of the sidewall of the opening is exposed.

15. The method of claim 11, wherein the steps of forming the spacer comprise:

forming a nitride layer to cover the oxide layer and the stop layer; and performing an etching back step.

16. The method of claim 11, wherein the step of forming the second dielectric layer comprises atmospheric pressure chemical vapor deposition.

17. The method of claim 11, wherein the step of forming the second dielectric layer comprises low-pressure chemical vapor deposition.

18. The method of claim 11, wherein the step of removing the oxide layer comprises performing a wet etching with a hydrofluoric acid solution.

19. A method of fabricating a conductive line structure, comprising:

providing a dielectric layer;

forming at least two conductive lines on the dielectric layer, wherein the conductive lines are spaced by an opening which exposes a part of the dielectric layer;

forming a spacer on an upper part of a sidewall of the conductive lines within the opening while leaving a lower part of the sidewall of the conductive lines not covered by the spacer; and forming an oxide layer with a void to fill the opening.

20. The method of claim 19, comprising further a step of forming a covering layer on the conductive lines.

* * * * *